United States Patent
Araujo

(10) Patent No.: US 9,388,486 B2
(45) Date of Patent: Jul. 12, 2016

(54) PISTON RING FOR INTERNAL COMBUSTION ENGINE

(75) Inventor: Juliano Avelar Araujo, Jundiai SP (BR)

(73) Assignee: MAHLE Metal Leve S/A, Jundial-SP (BR)

( * ) Notice: Subject to any disclaimer, the term of this patent is extended or adjusted under 35 U.S.C. 154(b) by 786 days.

(21) Appl. No.: 13/000,966

(22) PCT Filed: Jun. 26, 2009

(86) PCT No.: PCT/BR2009/000184
§ 371 (c)(1),
(2), (4) Date: Mar. 7, 2011

(87) PCT Pub. No.: WO2009/155677
PCT Pub. Date: Dec. 30, 2009

(65) Prior Publication Data
US 2011/0148047 A1    Jun. 23, 2011

(30) Foreign Application Priority Data
Jun. 26, 2008    (BR) .................................... 0803362

(51) Int. Cl.
*F16J 9/26*    (2006.01)
*C23C 14/06*    (2006.01)
*C23C 28/04*    (2006.01)

(52) U.S. Cl.
CPC ............ *C23C 14/0641* (2013.01); *C23C 28/044* (2013.01); *F16J 9/26* (2013.01)

(58) Field of Classification Search
CPC ...... F16J 9/26; C23C 14/0641; C23C 28/044; C32C 30/00
USPC .......................................... 277/440, 442–444
See application file for complete search history.

(56) References Cited

U.S. PATENT DOCUMENTS

| | | | |
|---|---|---|---|
| 3,787,229 A * | 1/1974 | Rudness | C04B 35/56 242/157 C |
| 5,154,433 A | 10/1992 | Naruse | |
| 5,316,321 A * | 5/1994 | Ishida et al. | 277/443 |
| 5,743,536 A * | 4/1998 | Komuro et al. | 277/440 |
| 7,081,186 B2 * | 7/2006 | Ehiasarian et al. | 204/192.12 |

(Continued)

FOREIGN PATENT DOCUMENTS

| | | |
|---|---|---|
| DE | 102004032342 | 2/2006 |
| DE | 102006046917 | 2/2008 |

(Continued)

OTHER PUBLICATIONS

"Tribological enhancement of CrN coatings by niobium and carbon ion implantation", Chang et al., Surface and Coatings Technology 177-178 (2004) 441-446.*
"The corrosion behavior of macroparticle defects in arc bond-sputtered Crn/NbN superlattice coatings" Wang et al., Surface and Coatings Technology 126 (2000) 279-287.*
Machine Translation of DE102006046915.*

(Continued)

*Primary Examiner* — Kristina Fulton
*Assistant Examiner* — Nicholas L Foster
(74) *Attorney, Agent, or Firm* — Alston & Bird LLP

(57) ABSTRACT

The present invention refers to a piston ring for internal combustion engine, having an outer surface of a coating of Chromium Nitride (CrN and $Cr_2N$) and Niobium Nitride (NbN and $Nb_4N_3$), capable of offering greater resistance to peeling of the coating, also maintaining an excellent level of resistance to wear and tear and scratches to the layer of Chromium Nitride deposited.

14 Claims, 1 Drawing Sheet

(56) References Cited

U.S. PATENT DOCUMENTS

| | | | |
|---|---|---|---|
| 2005/0109607 A1* | 5/2005 | Ehiasarian et al. | 204/192.15 |
| 2005/0218603 A1* | 10/2005 | Fischer | 277/443 |
| 2005/0255329 A1* | 11/2005 | Hazel | C23C 4/10 428/472 |
| 2006/0269790 A1* | 11/2006 | Sarabanda et al. | 428/698 |
| 2009/0068450 A1* | 3/2009 | Muenz et al. | 428/336 |
| 2009/0075114 A1* | 3/2009 | Hovsepian | C23C 14/022 428/650 |
| 2010/0044968 A1* | 2/2010 | Fischer et al. | 277/443 |
| 2010/0044969 A1* | 2/2010 | Fischer et al. | 277/443 |

FOREIGN PATENT DOCUMENTS

| | | | |
|---|---|---|---|
| DE | 102006046915 | * | 3/2008 |
| JP | 2001335878 | | 12/2001 |

OTHER PUBLICATIONS

International Search Report and Written Opinion, mailed Jul. 10, 2009, of corresponding international application No. PCT/BR2009/000184, filed Jun. 26, 2009.

Tan, et al, "Deposition and characterization of (Nb,Cr)N thin films by unbalanced magnetron sputtering," *Surface and Coating Technology*, vol. 167, Issues 2-3, Apr. 22, 2003, pp. 154-160.

Response to Written Opinion, dated Apr. 26, 2010, of corresponding international application No. PCT/BR2009/000184, filed Jun. 26, 2009.

International Preliminary Report on Patentability, mailed Sep. 9, 2010, of corresponding international application No. PCT/BR2009/000184, filed Jun. 26, 2009.

* cited by examiner

PISTON RING FOR INTERNAL COMBUSTION ENGINE

CROSS REFERENCE TO RELATED APPLICATIONS

This application is a national stage application, filed under 35 U.S.C. §371, of International Application No. PCT/BR2009/000184, filed Jun. 26, 2009, which claims priority to Brazilian Application No. PI0803362-5, filed Jun. 26, 2008, both of which are hereby incorporated by reference in their entirety.

BACKGROUND OF THE INVENTION

1. Field of Invention

The present invention refers to a piston ring for an internal combustion engine, more particularly, a piston ring having coatings of Chromium Nitride and Niobium Nitride, to confer greater resistance to wear of the ring during the useful life of the engine.

2. Description of Related Art

As a rule, the wear process that a material may sustain or cause, in contact with another, is a rather complex phenomenon. The tribological properties of the material are one of the main characteristics involved in this process.

The tribological properties are related to wear and tear and to the resistance of a material, when it is subject to frictional forces.

There is currently a growing demand for materials and/or components that offer greater resistance to wear and to corrosion, which has fostered interest for the area of surface engineering.

As far as the automobile sector is concerned, and more specifically, to the coating of piston rings of combustion engines, recent studies and research are being developed with a view to achieving materials that offer greater resistance to wear and tear, thus avoiding the rupture/breakage of the coating material, which would severely compromise its functional requirement.

Combustion engine piston compression rings are used to offset the inevitable gap existing between the piston and the cylinder wall, providing an efficient sealing for the combination when the engine is operating (chiefly when it compresses the air or air/fuel mix), in addition to enhanced performance. In this case, the ring avoids combustion gases from passing from the cylinder to the sump, besides preventing the lubricant from accessing the combustion chamber.

There are also oil-scraping rings having various constitutions and functions, which will not be detailed in this specification.

Due to the location of the compression rings in the piston and to the type of force to which they are submitted, among other factors, the rings undergo severe wear and tear processes, and chemical attacks from sub-products from the burning of the air-fuel mixture.

Today, a surprising enhancement in the efficiency of internal combustion engines is occurring, which generate ever greater potency with lesser displacements. Said increase in efficiency is particularly the result of the ever more severe laws limiting the emission of pollutants and the need to reduce the specific consumption of engines, and it is more fashionable than ever due to the increasingly talked of subject of global warning coming from the emission of carbon due to fossil fuel burning.

Some recent works and research have been designed to developed products that find a greater resistance to wear and tear, normally applying a coating and/or a treatment on the surface of the piston rings.

U.S. Pat. No. 5,743,536 describes a piston ring for an internal combustion engine, whose surface is coated by a friction material mainly comprised of Chromium Nitride. The coating is formed by the deposit of chromium nitride on the surface of the part desirable to apply using a process called PVD or physical vapor deposition.

The invention described in this document suggests the use of Chromium Nitride in the form CrN or $Cr_2N$. The proposed coating can also comprise a mixture of CrN and $Cr_2N$.

Further according to the U.S. Pat. No. 5,743,536, the coating is more resistant to the delamination of the surface of the ring, and to abrasion. The coating has a columnar crystalline structure thickness of from 1 to 80 μm, and porosity in the range of 1.5% to 20%.

U.S. Pat. No. 5,316,321 describes a piston ring for internal combustion engine, made from a titanium alloy, whose outer friction surface is coated by a hard film, using the process of physical vapor deposition for this deposition.

U.S. Pat. No. 5,316,321 also describes the use of one or more types of films for the coating of the piston ring, especially TiN (Titanium Nitride) and CrN (Chromium Nitride).

U.S. Pat. No. 5,154,433 describes a piston ring for internal combustion engine, and more particularly, a piston ring made of martensitic stainless steel coated with a Titanium Nitride film. According to one of the embodiments of the invention described in document U.S. Pat. No. 5,154,433, the coating of Titanium Nitride has a concentration of Nitrogen gradually decreasing on its surface, which confers the film a Vickers hardness of around 1800 HV or less.

US 2005/0218603 describes a piston ring for internal combustion engine made of steel, whose contact surface has a coating of aluminum nitride and/or silicone and/or zircon. The proposed coating presents a thickness less or equal to 70 μm, and is applied by physical vapor deposition.

It is noted, from the state of the art documents, that the Chromium Nitride film is widely used in the composition of an outer coating for the combustion engine piston ring, in order to confer greater resistance to wear and tear.

Recently, however, it was noted that in engines working in a high load regime, or engines working under high combustion pressure levels, degradation of the Chromium Nitride layer occurs, with the consequent formation of micro-cracks on their surface. The microcracks propagate until the covering starts to peel (a phenomenon known as delamination). The hard particles, resulting from delamination, loose in the system, may lead to severe wear of the piston ring and to a catastrophic failure of the engine.

Thus, the present invention offers a solution for the problem of delamination of the covering and greater resistance to wear and tear, proposing a piston ring comprised by an outer metallic coating, including Chromium Nitride, in the forms CrN or $Cr_2N$, and Niobium Nitride, in the forms NbN or $Nb_4N_3$.

BRIEF SUMMARY OF THE INVENTION

A first objective of the present invention is to propose a piston ring for internal combustion engine, having a coating of Chromium Nitride (CrN and $Cr_2N$) and Niobium Nitride (NbN and $Nb_4N_3$) on its outer surface, capable of offering greater resistance to the delamination of the coating (formation of microcracks and consequent delamination of the covering), also maintaining an excellent level of resistance to the wear and tear of the Chromium Nitride and Niobium Nitride covering deposited.

A way of achieving the objective of the present invention is by providing a piston ring for internal combustion engine comprising a base and at least an outer surface, the base being constituted of a given metallic alloy, the outer surface of the ring comprising the ceramic coating, the ceramic coating being comprised of a deposit of Chromium Nitride and Niobium Nitride. The coating has a columnar crystalline structure and comprises the combination of application phases of Chromium Nitride and Niobium Nitride, and the Niobium element is present in the range of 30% to 60% by weight, and the coating having porosity in a range less than 10%.

BRIEF DESCRIPTION OF THE FIGURES

The present invention will now be described in greater detail, with reference to the appended drawings, wherein.

DETAILED DESCRIPTION OF VARIOUS EMBODIMENTS OF THE INVENTION

Figure 1:
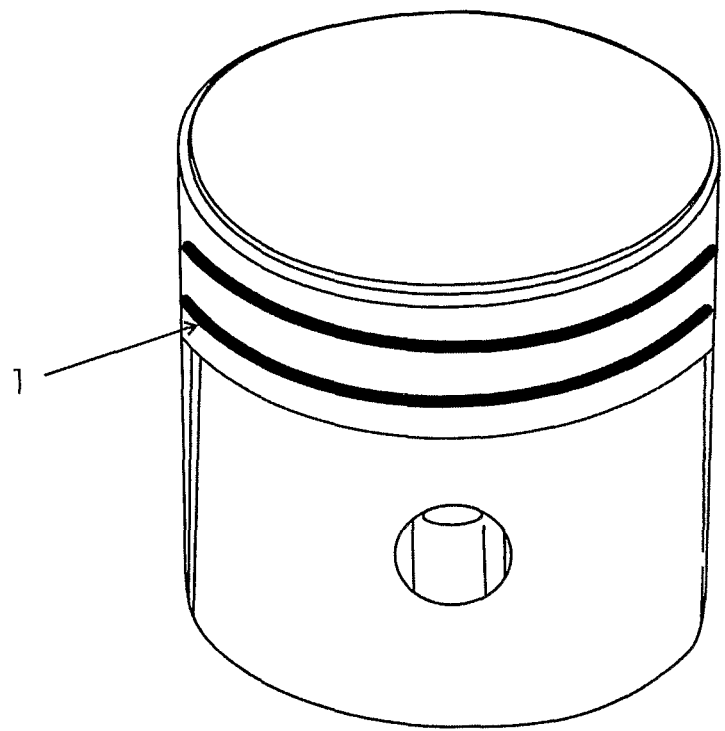
FIG. 1—depicts an illustrative view in perspective of a piston of an engine, having two compression rings.
Figure 2:
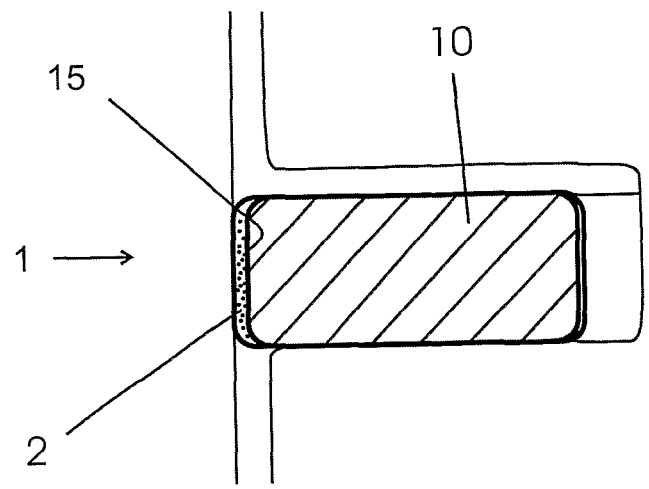
FIG. 2—depicts a cut schematic view of a configurative first variation of the compression ring that is the object of the present invention installed in the respective piston channel, highlighting the ring coating now proposed.

FIG. 1 illustrates a piston normally used in internal combustion engines that comprise two compression rings 1. FIG. 2 shows a configurative variation of the compression ring that is the subject matter of the present, installed in the piston channel and in contact with the wall of a cylinder, comprising a base (or body) 10 and at least an outer surface 15.

The base 10 is comprised of any metallic alloy at all, such as, for example, cast iron or steel, preferably nitrided, and the outer surface of the ring 1 comprises a coating 2, comprised by Chromium Nitride and Niobium Nitride. The coating 2 subject matter of the present invention is schematically illustrated in FIG. 2.

Niobium (Nb) was added to this coating to increase the value of its desirable mechanical properties. Said advantages, which will be commented upon ahead, derive from the fact that, atomically speaking, the Niobium Nitride presents reduced atomic distance, giving the coating 2 a denser structure, without presenting an increase in inner tensions.

Niobium Nitride (NbN or $Nb_4N_3$) is recognized for being a solid lubricant, and its use in piston ring coatings, according to tests performed by the applicant, considerably increases the properties resulting in relation to the coating currently used, made of Chromium Nitride (CrN).

In a more detailed explanation, with the use of Niobium Nitride (NbN or $Nb_4N_3$) it is possible to achieve a friction coefficient near to the existing coefficients in the self-lubricating coatings, such as those offered by a diamond-type carbon film or by a molybdenum bisulphide ($MoS_2$) film.

Preferably, the coating 2 of the piston ring 1 has a columnar crystalline structure, comprising a combination of phases of applying Chromium Nitride and Niobium Nitride.

Still preferably, the coating is of the monolayer kind, but optionally it can be multilayer.

Niobium Nitride has the capacity to interrupt the growth of the grains of Chromium Nitride. In this case, the size of the grains is reduced in the structure of Chromium Nitride present in the coating 2 when compared to the coatings of Chromium Nitride found in the state of the art, which increases its desired properties of tenacity and resistance to wear and tear.

As mentioned previously, the enhanced performance of the coating occurs because the Niobium Nitride presents a near-atomic nature, that is, a structure characterized by a greater approximation between atoms increasing the density of the coating without increasing the inner tensions.

Said structure increases the resistance when cracks appear in the coating 2. The Niobium Nitride and the Chromium Nitride are deposited, as shown in data set forth in table 1, particularly referring to the thickness of the coating 2 and percentage of Niobium.

The coating 2 has a columnar crystalline structure and comprises a combination of phases of Chromium Nitride and Niobium Nitride, the Niobium chemical element being applied in a range preferably from 30% to 60% by weight. Moreover, the coating has a porosity of less than 10%.

Defining the porosity value is very important because it theoretically acts as an internal tension controller of the coating 2 and a barrier so the corrosive gases arrive at the base 1. At the lower limit (porosity near zero), the coating is rather dense and has an elevated residual tension, which occasionally may render it more fragile. When the coating 2 has elevated porosity values, the resistance to wear and tear may be reduced, and may even allow corrosive gases from the chamber to permeate through these pores until they reach the base 1, generating corrosion points and consequent peeling of the layer.

Results of Bench-Top Tests

Initially, a significant experimental bench-top test was carried out on a piston ring as defined in the present invention with 35% to 55% by weight of Niobium in the coating layer. The results obtained are set forth in Table 1 below.

TABLE 1

| | Test | Coating | Thickness (μm) | Hardness (HV) | Niobium (% by weight) | Wear (μm) |
|---|---|---|---|---|---|---|
| Present Invention | 1 | CrN/NbN | 14 | 2030 | 45 | 1.2 |
| | 2 | CrN/NbN | 15 | 1840 | 53 | 1.1 |
| | 3 | CrN/NbN | 15 | 1930 | 55 | 1.6 |
| State of the art | 4 | CrN | 15 | 1300 | 0 | 3.0 |

Bench-top tests were performed on a reciprocating equipment for comparison of the ring with the covering NbN/CrN and with the ring of the state of the art, having Chromium Nitride (CrN) coating. Table 1 illustrates the results of the test described above, under the conditions of a load of 667 N at 500 rpm for 50,000 cycles.

Based on the data set forth in table 1, notably in tests 1 to 3, it is noted that the hardness achieved by the Niobium Nitride and Chromium Nitride coating is superior to the hardness presented by the coating normally used in the state of the art, constituted by Chromium Nitride alone. It is also important to point out that said advantageous results could be clearly confirmed in this wear and tear test, to the extent that the results tend to be more superior the longer the tests last.

Similarly, the wear of the rings to which Niobium Nitride was applied on the coating was considerably lower, showing figures between 1.1 μm and 1.6 μm, a result at least 50% better compared with the wear and tear of 3.0 μm presented by the conventional ring, in the same test and under the same test conditions.

A second set of tests was carried out, also testing piston rings constituted in accordance with the present invention, but with additional variations of the Niobium percentage present in the coating (% by weight).

These tests were also carried out on a desk-top, on the aforementioned reciprocating equipment, and again as counter evidence a ring from the state of the art was tested, the coating of which contained no Niobium, but only Chromium Nitride (CrN).

the sample is moved at a constant speed. The lower load in which the first failure occurs is called Critical Load (Lc). The equipment used provides data for cross referencing the critical load whilst at the same time recording the effects of: tangential force variation, indentor penetration depth and acoustic emission detection. After the test, a microscopic analysis of each scratch is performed to confirm the occurrence of the fault. The larger the load in which a fault occurs, the more resistant the delamination coating is.

|  |  |  | Properties | | | | | Performance | |
|---|---|---|---|---|---|---|---|---|---|
|  |  |  |  |  |  |  |  | Scratch test | |
|  | Test | Coating | Thickness (µm) | Hardness (HV) | Niobium (% by weight) | Oxygen (% by weight) | Porosity (%) | Wear (µm) | [delamination load (N)] | Engine test HDD - 500 hr |
| Present Invention | Test HC 1 Monolayer | CrN/NbN/Nb4N3 | 20 | 1700 | 55 | 0 | 3 | 1.2 | 131 | — |
|  | Test HC 2 Monolayer | CrN/NbN/Nb4N3 | 30 | 1740 | 46 | 0 | 5 | 1.3 | 180 | — |
|  | Test HC 3 Monolayer | CrN/NbN/Nb4N3 | 29 | 2200 | 49 | 0 | 6 | 1.4 | 180 | No peeling |
|  | Test HC 4 Multilayer | /NbN/CrN | 30 | 2100 | 35 | 0 | 4 | 1.1 | 180 | No peeling |
|  | Test HC 5 Multilayer | CrN//NbN/Nb4N3 | 30 | 2200 | 40 | 3 | 5 | 2.0 | 177 | No peeling |
| State of the Art | Test HC6 | CrN | 25 | 1300 | 0 | 0 | 4 | 3.8 | 100 | Peeling |

|  |  | Operating Parameters | | | | |
|---|---|---|---|---|---|---|
|  | Test | Rotation (%) | Total pressure (mBar) | Outflow N2 (sccm) | Distribution targets (Nb/C) | Polarization tension (V) |
| Present Invention | Test HC 1 Monolayer | 15 | 0.06 | 1940 | 2/2 | −17 |
|  | Test HC 2 Monolayer | 15 | 0.06 | 1940 | 2/2 | −17 |
|  | Test HC 3 Monolayer | 15 | 0.06 | 1940 | 1/3 | −17 |
|  | Test HC 4 Multilayer | 6 | 0.06 | 940 | 2/2 | −17 |
|  | Test HC 5 Multilayer | 6 | 0.06 | 940 | 2/2 | −17 |
| State of the Art | Test HC6 | 15 | 0.08 | 1180 | 0/4 | −15 |

Table 2 illustrates the results of the test described above, under the same conditions of 667 N of load at 500 rpm (revolutions per minute) for 50,000 cycles.

The tests presented in table 2 were obtained by using piston rings in accordance with the present invention, having a coating 2 with a percentage of Niobium Nitride in the coating of 35% to 55% by weight.

Test 1 used a ring with a percentage of Niobium by weight of 55%, whereas in tests 2 to 5 the percentage was respectively 46%, 49%, 35% and 40%.

As counter evidence, Test 6 was carried out on a state of the art ring, with Chromium Nitride coating without the presence of Niobium. The porosity of all the samples was recorded between 3% and 6%.

It is clear to see the performance advantages of the rings having Niobium in the composition of the coating layer, presenting a wear of between 1.1 µm and 2.0 µm, significantly reduced compared to the 3.8 µm in wear presented by the ring of the state of the art.

Additionally, a scratch test was carried out on the equipment that evaluates the resistance to delamination of the coating. The result of this test is achieved by applying a normal force to a covering-substrate system at the same time in which The scratches are made by a diamond tip, with Rockwell C geometry (angled of 120 degrees and spherical end), commensurate with the following parameters:

spherical end radius is 200 µm;

tip displacement rate of 4 mm/min towards the sample; and load of 180 N/min, applied progressively.

Identically, the resistance to delamination of the ring having Niobium in the coating layer compositions is decidedly superior to the resistance shown by the state of the art ring. Whereas the rings with Niobium sustain a load between 131 N (Newtons) to 180 N before delaminating (varying in accordance with the percentage of Niobium in the mixture), in the prior state of the art ring the maximum load supported is 100 N. Therefore, the ring that is the subject matter of the present invention has a yield at least 30% superior.

The data of table 2 corroborate the initial tests, that is, they highlight the advantageous properties of the rings that use Niobium Nitride in the composition of its coating layer in comparison with the state of the art ring.

What is more, it was easy to establish said advantageous results by way of the wear and tear tests performed on bench-top, such that the results tend to be far more superior the longer the duration of the tests or during the entire useful life of an internal combustion engine fitted with the rings now described.

The data in tables 1 and 2 show that the coating formed by Niobium Nitride and Chromium Nitride present a hardness superior to the coating found in the state of the art, but below the value of 2300 HV, which should not be exceeded under penalty of severe wear of the cylinder wall.

On this topic, the hardness value of about 2300 HV is the maximum amount considered reasonable by those involved with combustion engine projects and their components. Piston rings with coatings that are too hard tend to suffer severe wear and tear of the cylinder wall, causing low and slow initial accommodation and also a reduced useful life of the engine.

This is why, except in specific applications, coatings should have a hardness of about 2300 HV (or just under) and that do not present microcracks and fissures, precisely what was achieved with the coating 2 that is the subject matter of the present invention.

The hardness value found for the coating 2 that is the subject matter of the present invention, in each of the tests, draws reference to the Vickers hardness test. Measuring the Vickers hardness test is a method of classifying the hardness of the materials, based on a laboratory test.

The data presented in the tables highlights the least wear sustained by the coating made of Niobium Nitride and Chromium Nitride, the subject matter of the present invention, in relation to the coating made of Chromium Nitride alone.

Especially in the range of 35% to 55% by weight of the coating 2, the wear sustained by the coating proposed in the present invention achieves amounts near to a third of the value of wear and tear found in the state of the art, making this composition distinctly advantageous.

In order to prove greater resistance to the formation of microcracks and consequent delamination of the coating, tests were carried out on a diesel engine of 450 kW and 6 cylinders on a dynamometer under heavy load and in situations of accelerated thermal shock for 500 hours.

In these tests, on each pair of cylinders, a variation of the ring was used with a different percentage of Niobium by weight, on the coating layer. Simultaneously, state of the art rings were tested. Whereas the rings of the state of the art (CrN) presented peeling of the coating, the rings of the present invention, which had a Niobium percentage by weight of 45, 53 and 55%, presented no peeling.

Thus, the considerable increase in the resistance to delamination and durability of the piston ring 1 proposed in the present invention, coated with a deposit of Niobium Nitride and Chromium Nitride, in relation to rings belonging to the state of the art.

The application of Niobium Nitride brings advantageous results not only in the proportion mentioned above, from 35% to 55%, but also in other proportions, such as the range of 30 to 60% by weight of the coating 2, which is capable of developing hardness amounts and resistance to wear and tear similar to the coating tested.

Manipulating the percentage by weight of Niobium element inside the range of 30% to 60% must be carried out in accordance with the type of ring sought, considering all the variables applicable to each case (project and engine type, expected use profile, fuel with which the engine will operate, estimated useful life, desired cost, etc.).

It is further possible to assert that other percentages of Niobium in the mix have the characteristics of altering the ring properties, and may be used in accordance with the engine specification type and the likely operating conditions.

Preferably, the deposit of Niobium Nitride and Chromium Nitride is carried out by physical vapor deposition by cathodic arc, though it is also possible to use any other deposition techniques.

Preferably, the Chromium Nitride applied to the coating 2 comprises the form CrN, but the form $Cr_2N$ can also be used. Analogically, the coating 2 preferably comprises the form NbN for Niobium Nitride, but it is possible to apply the form $Nb_4N_3$.

The coating 2 has a thickness in the range of 10 to 70 μm. It is noted that in the products tested the thickness was about 30 μm.

It is further important to note that the base 10 of the piston ring 1 proposed in the present invention is preferably composed of cast iron. When the base 10 is made by steel, it preferably comprises Chromium in the range of 10 to 17%. Optionally, the material of which the base is made can be nitrided.

A possible embodiment of the ring 1 comprises an intermediate layer with an adhesive function comprised of Chrome, nickel or cobalt, deposited between the base 10 and the coating 2.

Still optionally, the coating 2 can also comprise no more than 10% of Oxygen (O) and/or Carbon (C) by weight.

Lastly, it is important to note that Niobium can be substituted by at least one of the following metals: Titanium (Ti), Zirconium (Zr), Hafnium (Hf), Vanadium (V), Tantalum (Ta), Molybdenum (Mo) and Tungsten (W), without the invention departing from the scope of protection defined by the claims appended hereto.

Having described examples of preferred embodiments, it should be understood that the scope of the present invention encompasses other possible variations, being limited only by the content of the appended claims, potential equivalents being included therein.

The invention claimed is:

1. A piston ring for internal combustion engine comprising a base and at least an outer surface, the base being comprised of a given metallic alloy, the outer surface of the ring comprising a ceramic coating, the ceramic coating being comprised of a deposit of Chromium Nitride and Niobium Nitride, wherein the ceramic coating:
   (i) has a porosity rate lower than 10%, has a columnar crystalline structure;
   (ii) comprises a combination of phases of Chromium Nitride and Niobium Nitride, the Niobium Nitride phase being present in the range of 30 to 40% by weight of the coating;
   (iii) the outer surface of the coating being composed of Niobium Nitride; and
   (iv) is a monolayer coating in contact with the base of the ring.

2. The piston ring for internal combustion engine according to claim 1, wherein the deposit is formed by a process of physical vapor deposition.

3. The piston ring for internal combustion engine according to claim 1, wherein the Chromium Nitride comprises the forms selected from the group consisting of CrN and $Cr_2N$.

4. The piston ring for internal combustion engine according to claim 1, wherein the Niobium Nitride comprises the forms selected from the group consisting of NbN and $Nb_4N_3$.

5. The piston ring for internal combustion engine according to claim 1, wherein the coating is comprised of a thickness in the range of 10 to 70 μm.

6. The piston ring for internal combustion engine according to claim 1, wherein the coating comprises a Vickers hardness in the range of 1500 to 2300 HV.

7. The piston ring for internal combustion engine according to claim 1, wherein the base is formed by cast iron.

8. The piston ring for internal combustion engine according to claim 7, wherein the cast iron is nitrided.

9. The piston ring for internal combustion engine according to claim 1, wherein the base is formed by steel with Chromium in the range of 10 to 17%.

10. The piston ring for internal combustion engine according to claim 9, wherein the steel is selected from the group consisting of nitrided steel and carbon steel.

11. The piston ring for internal combustion engine according to claim 1, further comprising an intermediate layer with adhesive function comprised of Chrome, Nickel or Cobalt, deposited between the base and the coating.

12. The piston ring for internal combustion engine according to claim 1, wherein the coating may additionally comprise no more than 10% of Oxygen (O) by weight.

13. The piston ring for internal combustion engine according to claim 1, wherein the coating may additionally comprise no more than 10% of Carbon (C) by weight.

14. The piston ring for internal combustion engine according to claim 1, wherein the Niobium element can be substituted by at least one of the following metals selected from the group consisting of: Titanium (Ti), Zirconium (Zr), Hafnium (HO, Vanadium (V), Tantalum (Ta), Molybdenum (Mo) and Tungsten (W).

\* \* \* \* \*